(12) United States Patent
Gullapalli et al.

(10) Patent No.: US 11,686,699 B2
(45) Date of Patent: Jun. 27, 2023

(54) SYSTEM AND METHOD FOR ANOMALY DETECTION AND TOTAL CAPACITY ESTIMATION OF A BATTERY

(71) Applicant: Analog Devices, Inc., Wilmington, MA (US)

(72) Inventors: Hemtej Gullapalli, Littleton, MA (US); Omer Tanovic, Cambridge, MA (US); Johannes Traa, Medford, MA (US); Erfan Soltanmohammadi, Melrose, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/389,202

(22) Filed: Jul. 29, 2021

(65) Prior Publication Data

US 2022/0091062 A1 Mar. 24, 2022

Related U.S. Application Data

(60) Provisional application No. 63/080,329, filed on Sep. 18, 2020.

(51) Int. Cl.
*G01R 31/00* (2006.01)
*G01N 27/22* (2006.01)
*H01M 10/42* (2006.01)

(52) U.S. Cl.
CPC ......... *G01N 27/221* (2013.01); *G01R 31/007* (2013.01); *H01M 10/425* (2013.01); *H01M 2010/4271* (2013.01)

(58) Field of Classification Search
USPC .......................................... 324/426, 432–435
See application file for complete search history.

(56) References Cited

U.S. PATENT DOCUMENTS

| | | | |
|---|---|---|---|
| 2011/0270559 A1* | 11/2011 | Christophersen .... | G01R 31/389 702/65 |
| 2012/0007556 A1* | 1/2012 | Matsui ..................... | B60L 3/04 320/112 |
| 2019/0207388 A1* | 7/2019 | Li ......................... | G06Q 10/067 |

(Continued)

FOREIGN PATENT DOCUMENTS

| | | |
|---|---|---|
| CN | 102116844 | 7/2011 |
| JP | 2016090346 | 5/2016 |

(Continued)

OTHER PUBLICATIONS

"International Application Serial No. PCT/US2021/046957, International Search Report dated Dec. 8, 2021", 3 pgs.

(Continued)

*Primary Examiner* — Vincent Q Nguyen
(74) *Attorney, Agent, or Firm* — Schwegman Lundberg & Woessner, P.A.

(57) ABSTRACT

The battery monitoring techniques described herein may be used for detection of battery anomalies or faults. Also, the battery monitoring techniques described herein may be used to generate estimates of total battery capacity. The battery monitoring techniques may employ an alternating current frequency response (ACFR) of the battery. The ACFR response of the battery may be used to detect anomalies and/or estimate a total capacity of the battery.

14 Claims, 12 Drawing Sheets

(56) References Cited

U.S. PATENT DOCUMENTS

2020/0033414 A1    1/2020  Izumi et al.
2020/0379049 A1*  12/2020  Gray ................... G01R 31/367

FOREIGN PATENT DOCUMENTS

| JP | 2020020604 | 2/2020 |
| JP | 2020034383 | 3/2020 |
| KR | 101974015  | 5/2019 |
| WO | 2022060533 | 3/2022 |

OTHER PUBLICATIONS

"International Application Serial No. PCT/US2021/046957, Written Opinion dated Dec. 8, 2021", 4 pgs.
"International Application Serial No. PCT US2021 046957, International Preliminary Report on Patentability dated Mar. 30, 2023", 6 pgs.

* cited by examiner

SYSTEM AND METHOD FOR ANOMALY DETECTION AND TOTAL CAPACITY ESTIMATION OF A BATTERY

CLAIMS OF PRIORITY

This patent application claims the benefit of priority U.S. Provisional Patent Application Ser. No. 63/080,329, titled "A SYSTEM AND METHOD FOR ANOMALY DETECTION AND TOTAL CAPACITY ESTIMATION OF A BATTERY," filed on Sep. 18, 2020, which is hereby incorporated by reference herein in its entirety.

TECHNICAL FIELD

The present disclosure generally relates to a Battery Management System (BMS), in particular anomaly detection and total capacity estimation.

BACKGROUND

Electric vehicles (EVs) are gaining popularity. One challenge for the adoption of EVs is battery maintenance. A battery management system (BMS) can be used to monitor different operating conditions of a battery, such as those used in EVs. Typically, conditions such as voltage and surface temperature can be measured using a BMS. While these conditions can provide a general indication of the battery's condition, they do not provide a complete picture of the battery's health. Accordingly, the inventors recognized, among other things, a need for improved battery monitoring techniques, which can provide more comprehensive information about the battery's state of health.

BRIEF DESCRIPTION OF THE DRAWINGS

Various ones of the appended drawings merely illustrate example embodiments of the present disclosure and should not be considered as limiting its scope.

DETAILED DESCRIPTION

The battery monitoring techniques described herein may be used for detection of internal faults (also referred to as anomalies). Also, the battery monitoring techniques described herein may be used to generate estimates of total battery capacity. The battery monitoring techniques may employ an alternating current frequency response (ACFR) of the battery (also sometimes referred to as Electrochemical Impedance Spectroscopy (EIS)). The ACFR response of the battery may be used to detect anomalies and/or estimate a total capacity of the battery.

The document describes a method to monitor a battery. The method includes: receiving a first impedance measurement from the battery in response to a first multi-frequency sweep; receiving a second impedance measurement from the battery in response to a second multi-frequency sweep; and based on the first and second impedance measurements, determining an estimated capacity of the battery using a regression model.

This document also describes a method to detect an anomaly in a battery. The method includes receiving a first impedance measurement from the battery in response to a first multi-frequency sweep; receiving a second impedance measurement from the battery in response to a second multi-frequency sweep; and based on the first and second impedance measurements, detecting an anomaly in the battery.

This document further describes a battery management system. The system includes at least one hardware processor and at least one memory storing instructions that, when executed by the at least one hardware processor, cause the at least one hardware processor to perform operations comprising: receiving a first impedance measurement from the battery in response to a first multi-frequency sweep; receiving a second impedance measurement from the battery in response to a second multi-frequency sweep; based on the first and second impedance measurements, generating an estimated capacity of the battery using a regression model; and detecting an anomaly in the battery.

Figure 1:
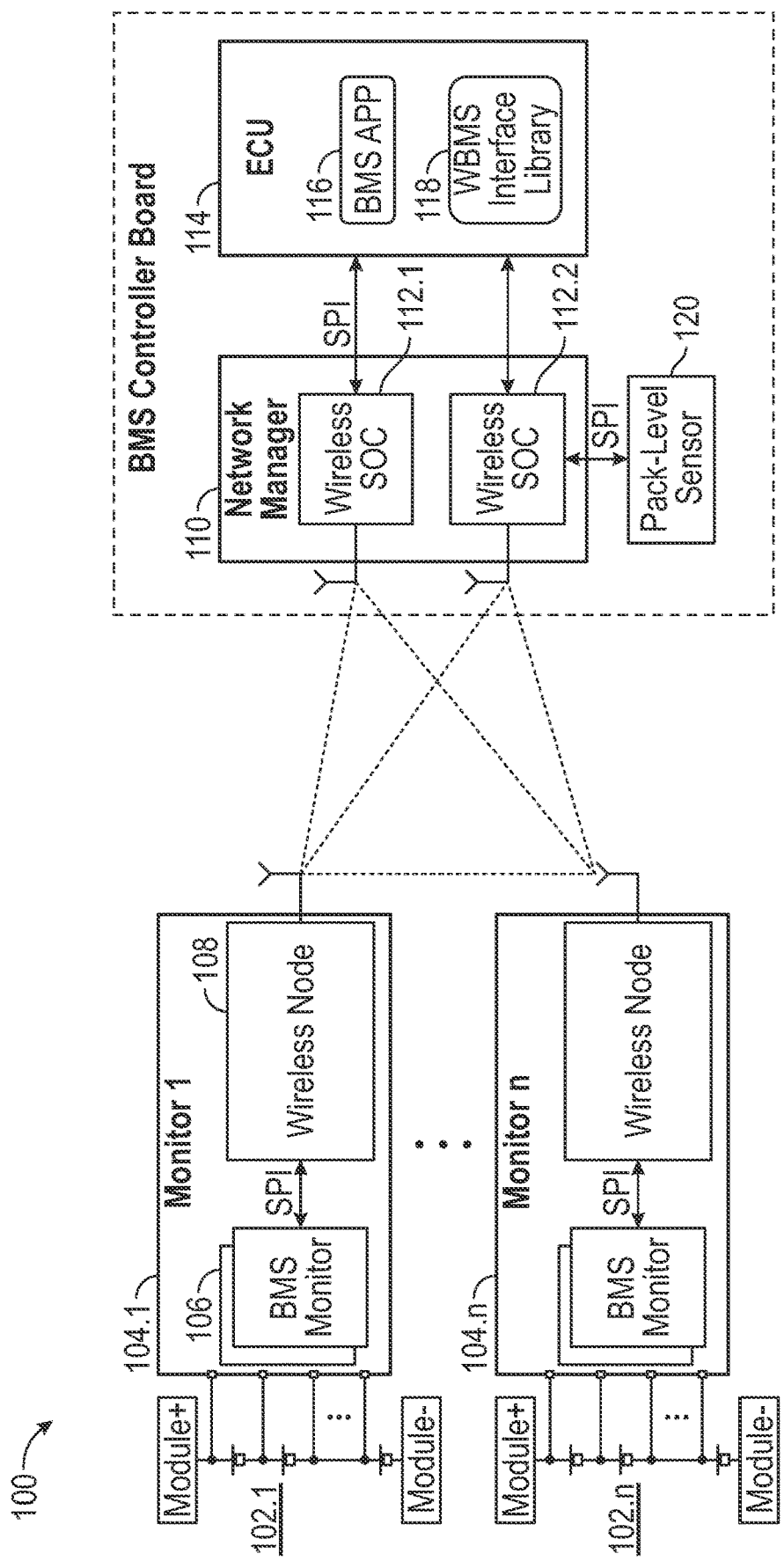
FIG. 1 illustrates a block diagram of a wireless battery management system.

The battery monitoring techniques described herein may be used in a wired BMS, a wireless BMS (WBMS), or a combination thereof. FIG. 1 illustrates a block diagram of a WBMS 100. The WBMS 100 may include a plurality of battery modules 102.1-102.$n$, each including a plurality of battery cells. For example, the battery modules 102.1-102.$n$ may be lithium ion batteries. Batteries with different specifications, sizes, and shapes may be used. Each module may be coupled to a respective Monitor 104.1-104.$n$. The WBMS 100 may also include a Network Manager 110 and an Electronic Control Unit (ECU) 114.

Each Monitor 104.1-104.$n$ may include one or more BMS Monitors 106 and a Wireless Node 108. The BMS Monitor 106 may be coupled to a battery module and may monitor various conditions or properties of the battery module. The BMS Monitor 106 may be provided as an integrated circuit, which can include a monolithically integrated BMS circuit or an integrated module including multiple integrated circuit die or other circuit elements within a commonly-shared integrated circuit device package, as illustrative examples.

The BMS Monitor 106 may include a variety of sensors. The BMS Monitor 106 may sample the battery voltage to monitor the battery level. The BMS Monitor may also monitor current of the battery module and the external surface temperature. In an embodiment, the BMS Monitor 106 may include a stimulus signal generator to generate a stimulus signal. The BMS Monitor 106 may inject the stimulus signal into the battery module and then monitor the impedance response to the stimulus signal in a synchronous manner. The impedance response may be monitored by measuring the voltage response of the battery to the stimulus signal.

The BMS Monitor 106 may be coupled to the Wireless Node 108 by a communication interface, for example by a Serial Peripheral Interface (SPI) or the like. The BMS Monitor 106 and the Wireless Node 108 may be provided on a single printed circuit board (PCB). The Wireless Node 108 may include wireless system on chip (SoC), which may include a radio transceiver to communicate the battery measurements to the Network Manager 110 over a wireless network. In an example, the wireless node 108 may include a Functional Safety (FuSa) central processing unit (CPU) to handle certain battery condition measurements.

The Network Manager 110 may include one or more wireless SOCs 112.1-112.2 to communicate with the Monitors 104.1-104.n. The Network Manager 110 may be coupled to the ECU 114 and a pack-level sensor 120 by respective communication interfaces, for example SPI. The ECU 114 may include a BMS app 116 and WBMS interface library 118 to control operation of the WBMS 100.

Figure 2:
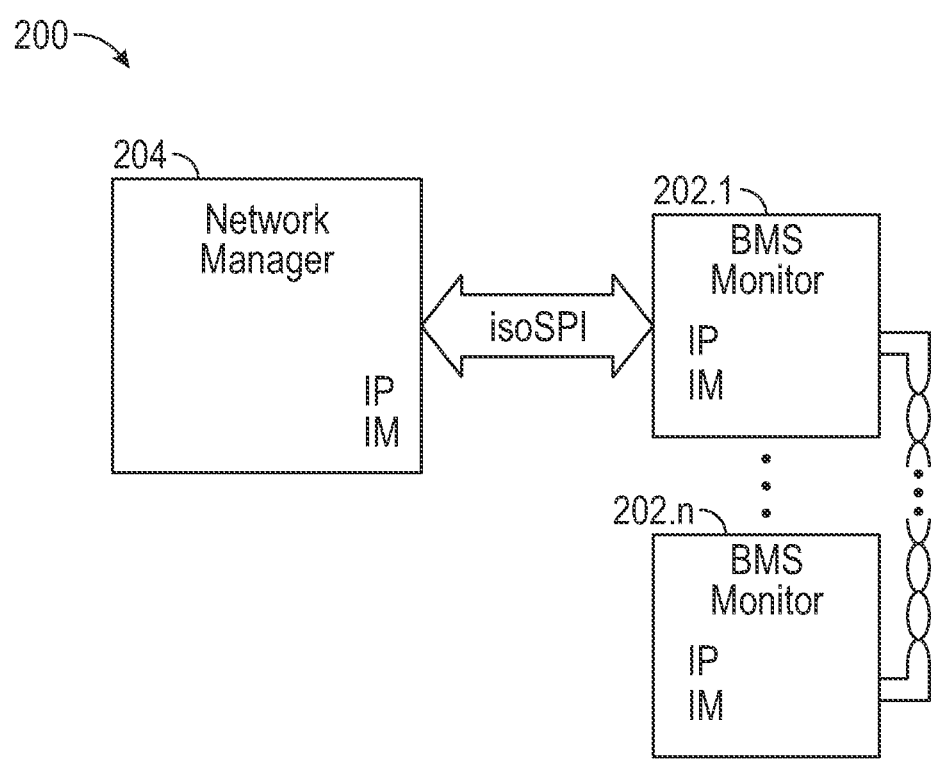
FIG. 2 illustrates a block diagram of a wired battery management system.

FIG. 2 illustrates a block diagram of a wired BMS 200. The wired BMS 200 may include a plurality of BMS Monitors 202.1-202.n and a Network Manager 204. As described above with reference to FIG. 1, the BMS Monitors 202.1-202.n may include a variety of sensors. The BMS Monitor 202.1-202.n may sample the battery voltage to monitor the battery level. The BMS Monitor 202.1-202.n may also monitor current of the battery module and the external surface temperature. In addition, the BMS Monitor 202.1-202.n may include a stimulus signal generator to generate a stimulus signal. The BMS Monitor 202.1-202.n may inject the stimulus signal into the battery module and then monitor the impedance response to the stimulus signal in a synchronous manner. The impedance response may be monitored by measuring the voltage response of the battery to the stimulus signal.

The BMS Monitors 202.1-202.n may communicate with the Network Manager 204 through a wired communication interface in this example. For example, the wired communication interface may include isolated (transformer) communication cabling, such as implementing an Isolated Serial Peripheral Interface (SPI). The communication cabling may be connected in a serial fashion from module to module, e.g., daisy chained from monitor to monitor with the last slave monitor providing a termination point for the cabling.

A stimulus signal for may be generated using a variety of different hardware configuration. It may be generated internally in the BMS monitor as described above with referenced to FIGS. 1 and 2. Additionally or alternatively, it may be generated using external equipment coupled to the BMS. A stimulus signal may be generated on an ad-hoc basis to acquire the ACFR. As described below, a plurality of multi-frequency impedance sweeps may be collected during specified times, such as at charging and/or during steady state. These impedance sweeps may then be used for anomaly detection and/or total capacity estimation.

Figure 3:
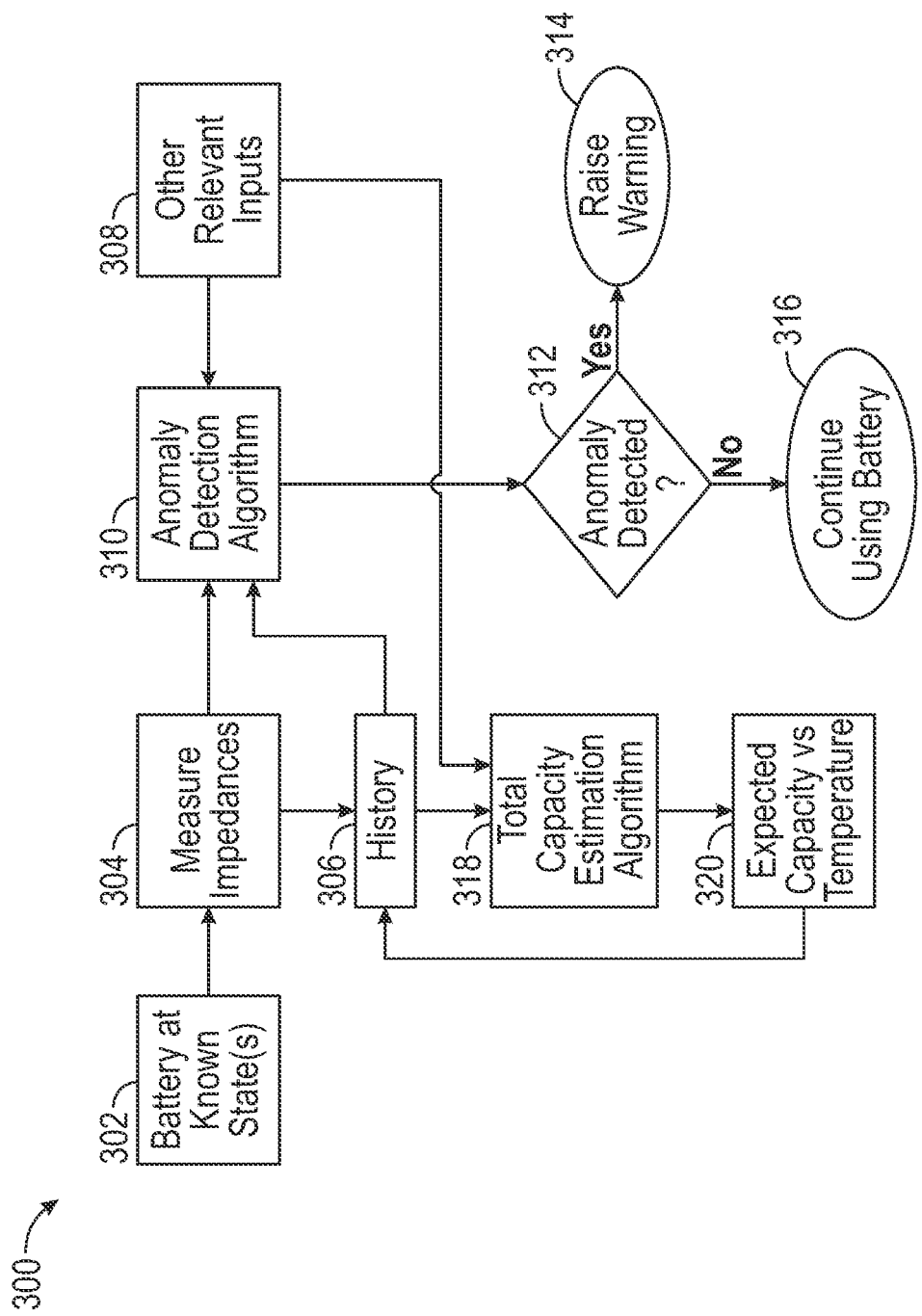
FIG. 3 illustrates a flow diagram for a method for monitoring a battery.

FIG. 3 illustrates a flow diagram for a method 300 for monitoring a battery. At 302, the battery may be at known state(s). In an example, the battery may be at an excited state (e.g., full charge) or steady state or a combination thereof. Steady state may be characterized by stable current and/or battery temperature. In one example, steady state can be defined as battery at rest at some known state-of-charge at a relatively constant temperature of the battery environment. As such, steady state may include a battery in thermal equilibrium (i.e., relatively constant temperature across the body of the battery).

At 304, a plurality of multi-frequency impedance sweeps in response to stimulus signals may be collected. Examples of multi-frequency impedance sweeps are described in further detail below.

At 306, historical data of the battery may be updated based on the measured impedance values. At 308, other relevant inputs related to the battery state may be collected. These inputs may be directly measured or indirectly calculated from battery or other measurements. In an example, battery terminal voltage and battery state-of-charge may be measured and used as inputs. In another example, history of previous measurements may be used as inputs. In another example, non-battery measurements may be used as inputs, such as temperature or humidity of the battery environment.

At 310, an anomaly detection algorithm may be performed based on the measured impedance values, the historical data of the battery, and other relevant inputs to detect the presence of an anomaly. Examples of anomaly detection are described in further detail below. Anomaly may include a fault condition of the battery. For example, a deviance from a previous impedance measurement may be flagged as a potential defect in the battery. A battery fault can be caused by several factors.

For example, a battery fault can be caused by manufacturing defects. These can include compromised materials such as electrode particle size variance/impurities, electrolyte degradation, moisture contaminant, current collector oxidation, etc. Manufacturing defects can also include compromised components such as inhomogeneity in electrode coatings, dissolved gases, etc. Manufacturing defects can further include compromised assembly such as over-/under-filling of electrolyte, incorrect winding, incorrect stack pressure, defective cell seal, incomplete degassing (after formation), etc. Moreover, manufacturing defects can include compromised formation such as timing issues, electrical inconsistencies, improper electrode wetting, outgassing, etc.

A battery fault can also be caused by operation issues such as over discharge (intentional, long shelf life), over charge, thermal stress (storage, charging, discharging), high currents (spikes, charging), altitude, etc. A battery fault can further be caused by accidents resulting in electrical malfunction (e.g., external shorts), pressure, shock, impact, etc.

Faults can result in rapid degradation (e.g., battery fire due to a collision) or slow degradation (e.g., small foreign particle inside can lead to accelerated aging of battery within 20% of its life). Slow propagating defects usually seed as a smaller anomaly within a cell which can grow into more noticeable defects after certain usage cycles. The anomaly detection technique described herein may detect these anomalies based on deviation of impedance measurements when the anomalies are early in their manifestation.

At 312, the presence or absence of an anomaly may be determined. If an anomaly is detected, a warning may be raised at 314. If no anomaly is detected, the battery may be continued to be used at 316.

At 318, a total capacity estimation algorithm may be performed based on the measured impedance values, the historical data of the battery, and other relevant inputs. Examples of total capacity estimation techniques are described in further detail below. At 320, the expected total capacity may be determined. In an example, the total capacity may be determined based on different environment temperatures. The total capacity information may also be used to update the historical information of the battery.

Figure 4:
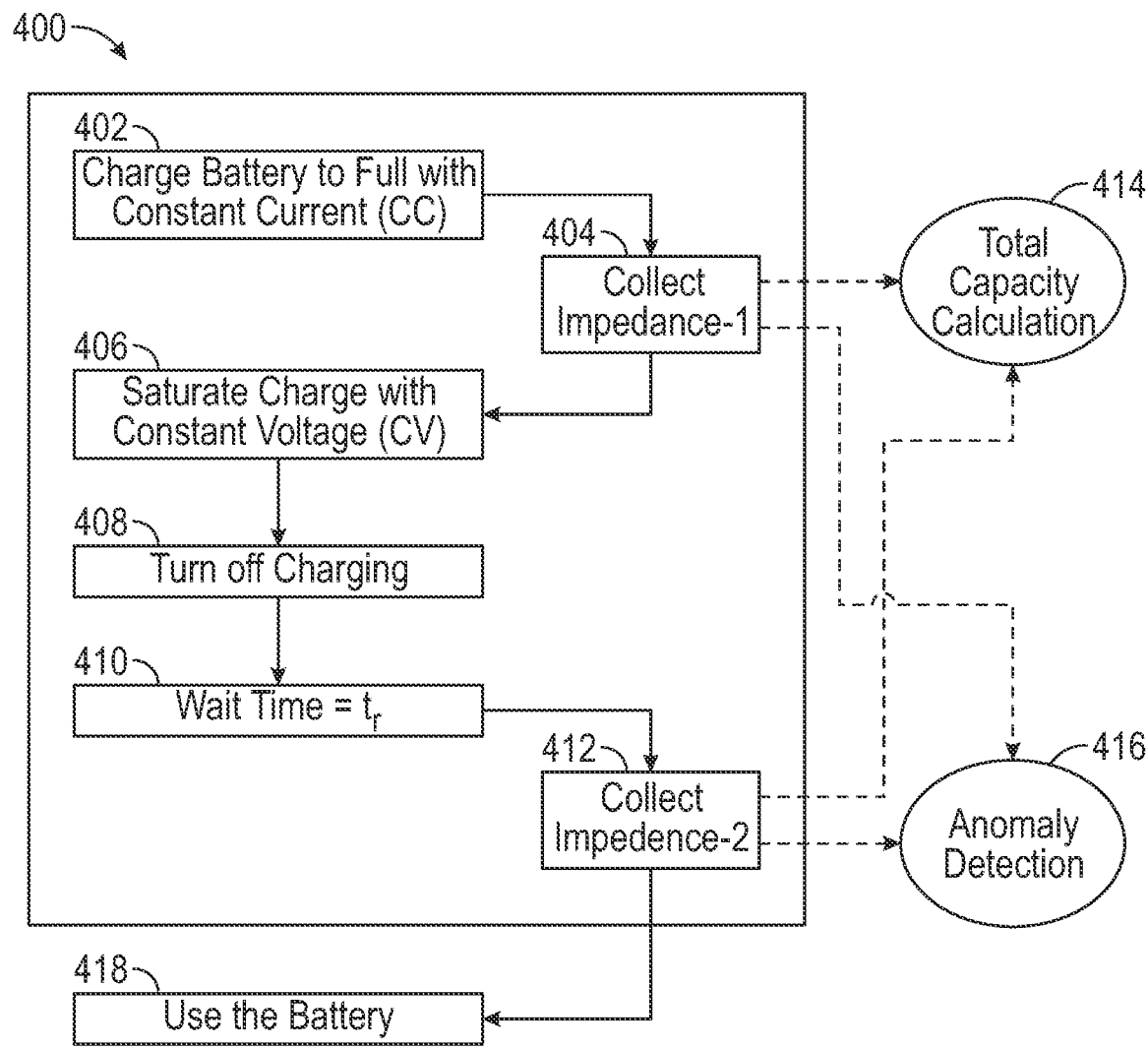
FIG. 4 illustrates a flow diagram for a method 400 for measuring a battery during a charge cycle.
Figure 5:
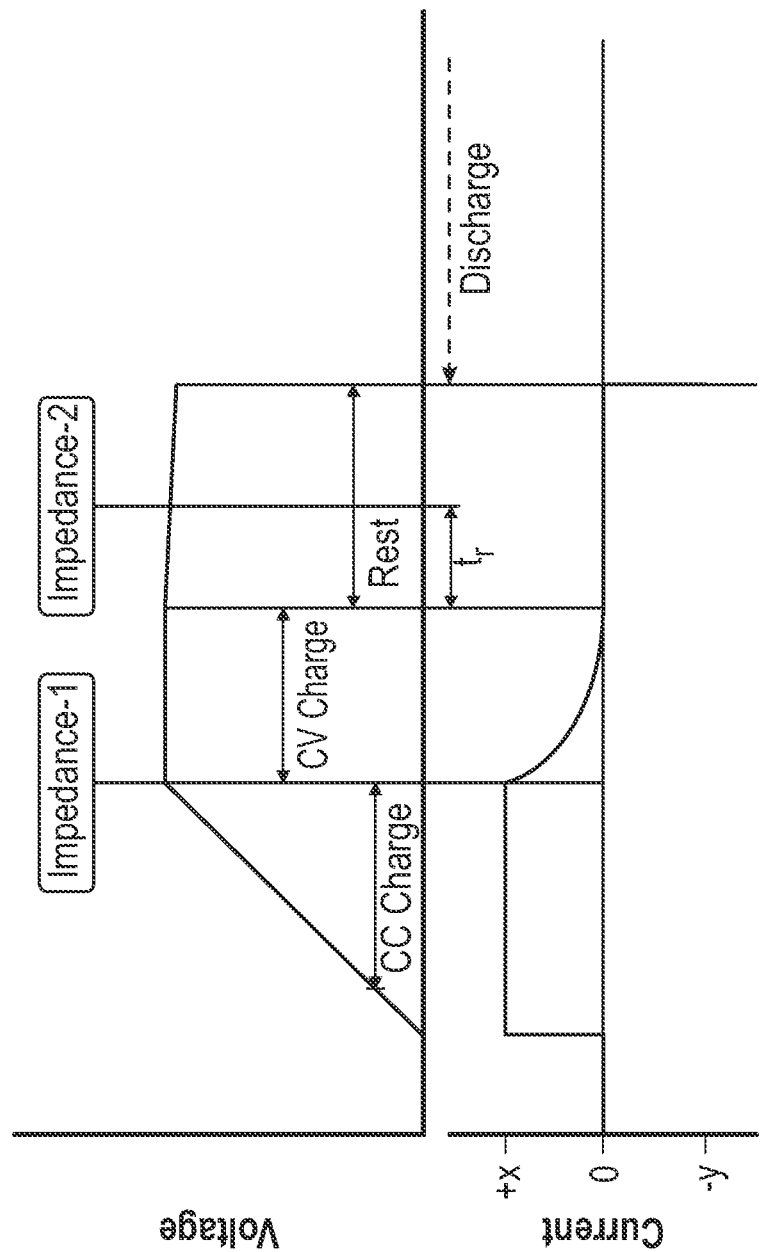
FIG. 5 illustrates voltage and current profiles of a battery during charging.

FIG. 4 illustrates a flow diagram for a method 400 for measuring a battery during a charge cycle. FIG. 5 illustrates voltage and current profiles of a battery during charging.

Method 400 may be performed on an ad-hoc basis and/or every requested cycle. For example, the battery may be monitored every nth cycle of charging, where n is an integer equal to or greater than 1. For example, if the battery is located in an EV, the measurements can be performed when the EV is being charged in relatively stable temperatures (e.g., in a garage overnight) once every few charging cycles when possible.

In an example, two or more multi-frequency impedance sweeps may be collected during the charging cycle. At 402, the battery may be charged to full with a constant current (CC). At 404, the first impedance sweep may be collected after the battery is fully charged with the CC. Stimulus signals corresponding to several frequencies in the range of 1 Hz to 1 kHz may be used. At 406, after the first impedance measurement, the battery may be saturated with a constant voltage (CV). At 408, the charging may be turned off. At 410, a waiting time, $t_r$, may be observed. At 412, after $t_r$, the second impedance sweep may be collected. Stimulus signals corresponding to several frequencies in the range of 1 Hz to 1 kHz may be used. As described in further detail below, total capacity calculation 414 may use one or both impedance responses and, likewise, anomaly detection 416 may use one or both impedance responses. At 418, the battery may be continued to be used (or use may be discontinued if an anomaly is detected).

Figure 6:
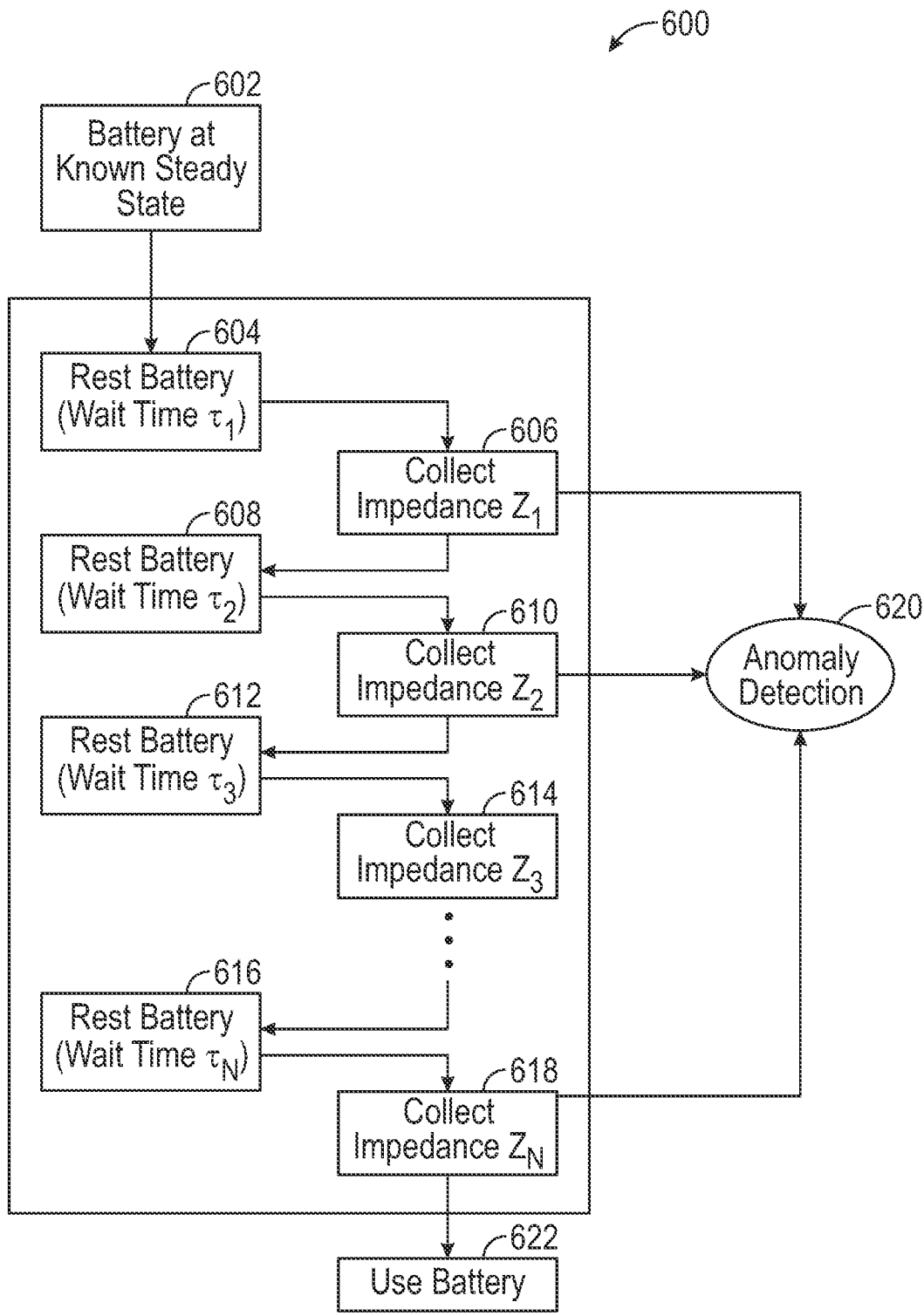
FIG. 6 illustrates a flow diagram for a method for measuring a battery during steady state conditions.

The impedance measurements may also be taken during steady states of the battery. As described above, steady state may be characterized by stable current and/or battery temperature. In one example, steady state can be defined as battery at rest at some known state-of-charge at a relatively constant temperature of the battery environment. As such, steady state may include a battery in thermal equilibrium (i.e., relatively constant temperature across the body of the battery). FIG. 6 illustrates a flow diagram for a method 600 for measuring a battery during steady state conditions. At 602, a known steady state of the battery may be detected. Next, multiple impedance measurements of the battery may be taken. At 604, a first wait time $\tau_1$ may be observed. At 606, a first impedance sweep may be collected ($Z_1$). At 608, a second wait time $\tau_2$ may be observed. At 610, a second impedance sweep may be collected ($Z_2$). At 612, a third wait time $\tau_3$ may be observed. At 614, a third impedance sweep may be collected ($Z_3$). This process may continue until, an nth wait is observed at 616, and an nth impedance sweep may be collected ($Z_n$), where n is an integer greater than 1. At 618, anomaly detection may be performed based on the collected impedance values (($Z_1$-$Z_n$) and may use one or both impedance responses. At 620, the battery may be continued to be used (or use may be discontinued if an anomaly is detected).

Figure 7:
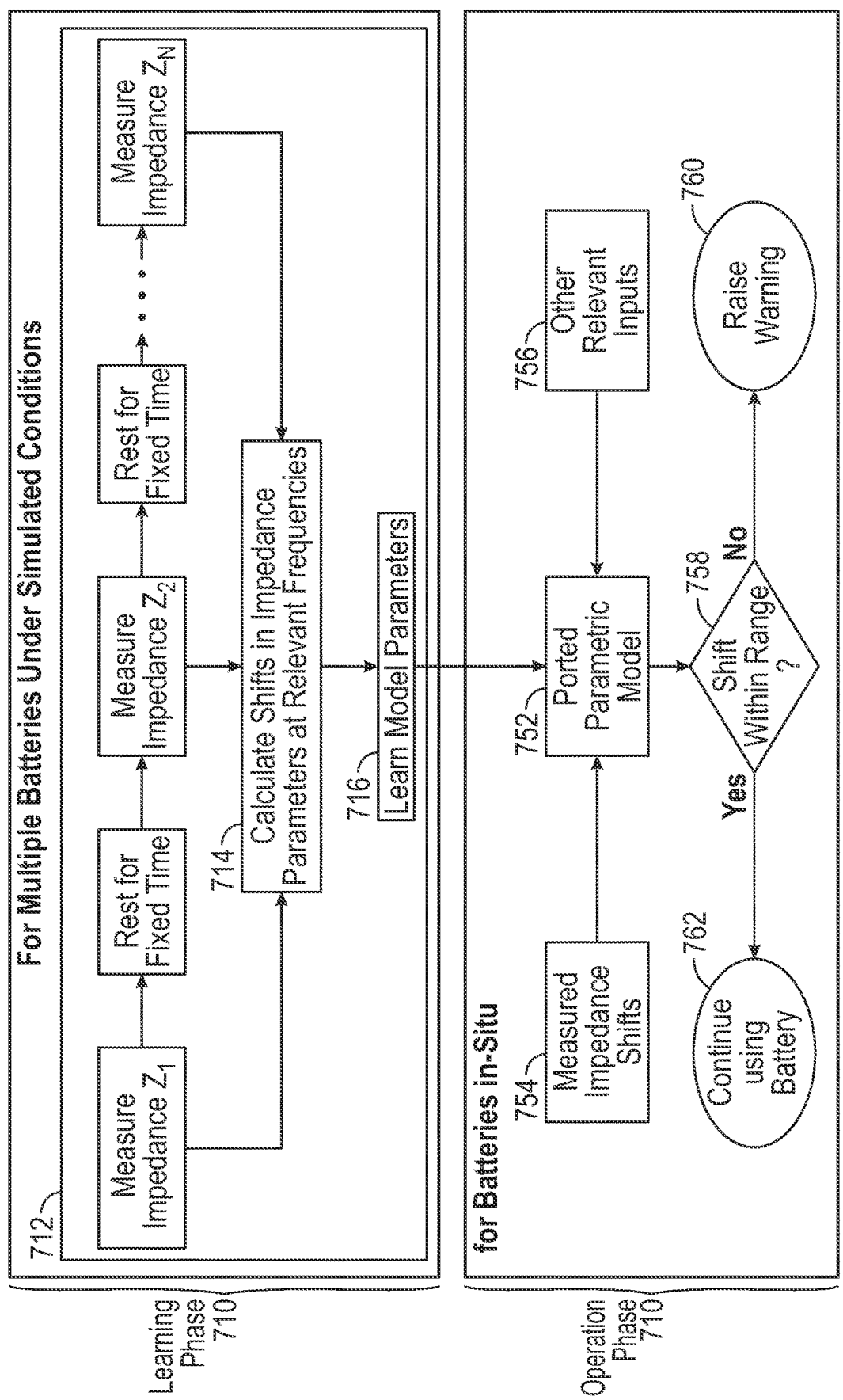
FIG. 7 illustrates a flow diagram for a method for detecting an anomaly.

FIG. 7 illustrates a flow diagram for a method 700 for detecting an anomaly. The anomaly-detection method 700 may be classified in two phases: 1) a learning phase 710, and 2) an operation phase 750. In the learning phase 710, multiple batteries of the same type may be used under simulated conditions. At 712, multiple impedance responses (two or more), as described above, may be measured for every cycle. The impedance responses may be measured during charging and/or steady state conditions, as described above with reference to FIGS. 4-6. At 714, based on the measured impedance responses, a shift in impedance parameters at relevant frequencies may be calculated. At 716, these calculated shift impedance values may be used to build a model (e.g., learned model parameters). This model may be parametrized by various variables, such as battery age, state-of-charge, battery temperature, battery form factor and configuration, etc. For example, this model may represent distribution of the shifts in impedance parameters. In one example, this distribution of the shifts could be modeled using a mixture model.

In the operation phase 750, the test battery alone is used. Here, the battery may be located in the incorporated device (e.g., EV). At 718, the model generated in the learning phase 710 may be ported. At 754, multiple impedance responses may be measured. In an example, at the top of the charge for every nth cycle, two or more impedance responses, as described above with reference to FIGS. 4-5, may be measured. In another example, the impedance responses may be taken when the battery is determined to be in a known steady state, as described above with reference to FIG. 6. In another example, the impedance responses may be taken during a charging cycle and steady state. Based on the measured impedance responses, a shift in impedance parameters may be calculated. The shift in impedance parameters may be calculated between any two measurements. In one example, the shift may be calculated between every two consecutive measurements. In another example, the shift may be averaged over different measurements At 756, other relevant inputs (e.g., last known age of battery) related to the battery state may be collected. These inputs may be directly measured or indirectly calculated from battery or other measurements. In an example, battery terminal voltage and battery state-of-charge may be measured and used as inputs. In another example, history of previous measurements may be used as inputs. In another example, non-battery measurements may be used as inputs, such as temperature or humidity of the battery environment.

At 758, based on the other relevant inputs and the model generated during the learning phase, the measured shift in impedance parameters may be compared against the expected distribution of the shift values. In one example, the measured shift may be compared to the expected value for the impedance shift, and if the distance between the measured and the expected values is larger than some threshold, then a warning may be raised, indicating the presence of an anomaly. If an anomaly is detected, a warning may be raised at 760. If no anomaly is detected, the battery may be continued to be used at 762.

AC impedance is sensitive to the charge distribution among various components in an electrochemical cell. When the battery is charged and allowed to rest, the charge distribution may relax over time. For a defective battery, this relaxation is non-ideal and may be accelerated. Using the anomaly detection technique described herein (e.g., two or more impedance measurements spaced by a predefined time), the relaxation trend may be modeled and deviation from the model may be detected to indicate the presence of an anomaly.

Moreover, using the measured impedance responses, total capacity of the battery (e.g., total amount of energy it can hold when fully charged at certain specified conditions such as temperature and load as specified by the manufacturer) may also be calculated using historical data of the battery and other relevant inputs. Moreover, from the calculated total capacity at measurement temperature, the total battery capacity that can be expected at different temperatures may be calculated. This information may be valuable for an EV implementation because temperature can affect battery capacity. For example, the battery in an EV may be charged at a first temperature (e.g., close to room temperature in a garage) but is used when the EV is driven outside at a second temperature different from the first temperature.

Figure 8:
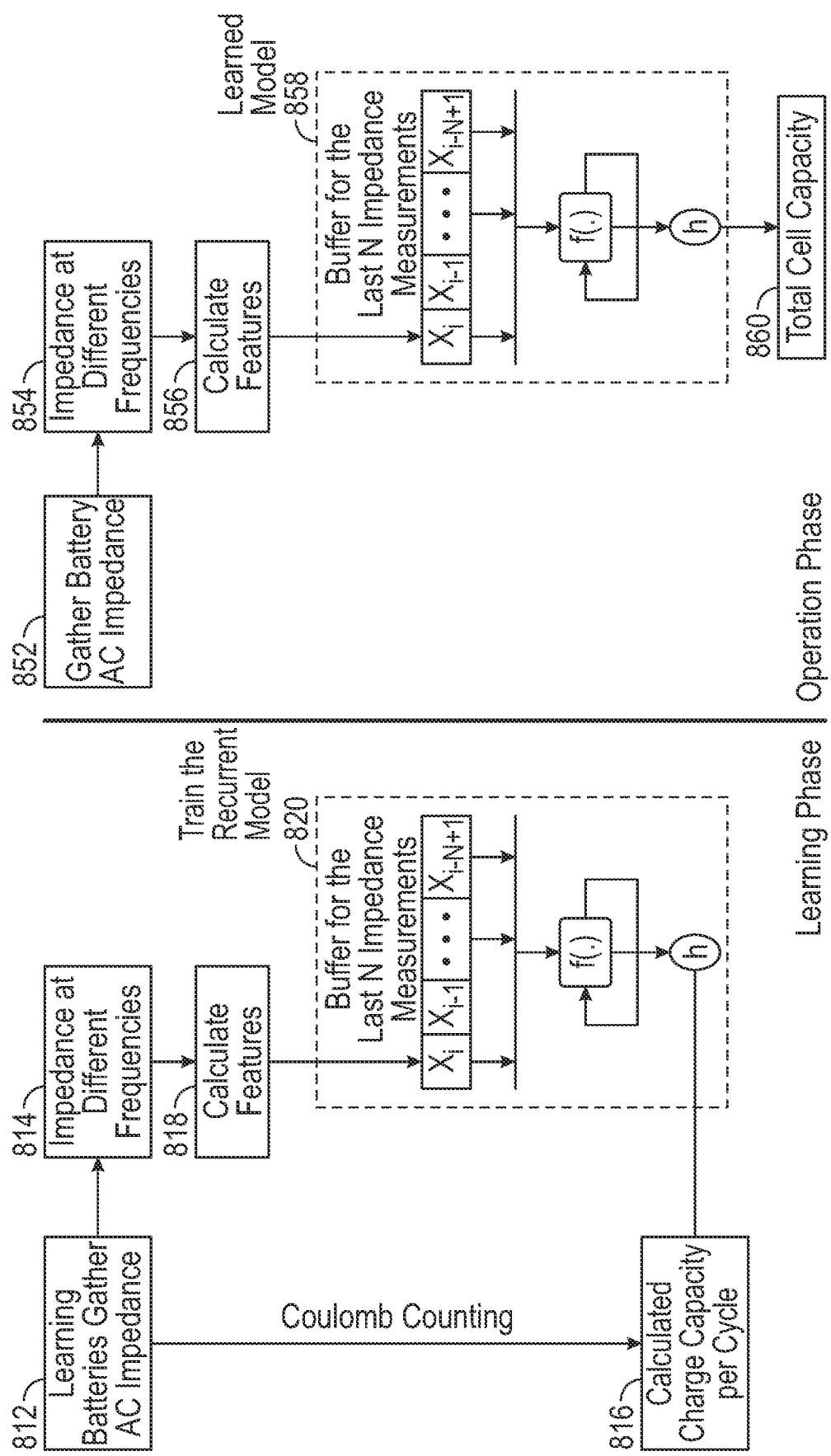
FIG. 8 illustrates a flow diagram for a method 800 for calculating total capacity of a battery.

FIG. 8 illustrates a flow diagram for a method 800 for calculating total capacity of a battery. The total-capacity-estimation method 800 may be classified in two phases: 1) a learning phase 810, and 2) an operation phase 850. In the learning phase 810, multiple batteries of the same type may be used under simulated conditions. At 812, multiple impedance responses (two or more), as described above, may be measured for every cycle. The impedance responses may be measured during charging and/or steady state conditions, as described above with reference to FIGS. 4-6. At 814, based on the measured impedance responses, impedance responses at different frequencies may be collected.

At 816, Coulomb counting may be employed to calculate charge capacity per cycle.

At 818, based on the measured impedance responses, features of the battery may be calculated. At 820, these calculated features may be used, along with the calculated charge capacity per cycle, to train a recurrent neural network model, as shown. The model may use the last N values, corresponding to the last N impedance measurements.

Other (smooth) regression models may also be used. The model may map impedance measurements and possibly other measured or derived features to an estimate of full charge capacity. Derived features may include equivalent circuit model (ECM) parameters, terminal voltage, temperature, and state-of-charge. Other models may include, but are not limited to: linear regression, polynomial regression, generalized additive model (GAM), and gaussian process (GP) regression. Different models could be chosen for a given implementation depending on computational and memory requirements and the availability of data.

The use of history in a neural network model is an extension of a non-history-enabled model. History of the battery can also be used in the other models. Moreover, neural network models without recurrence (e.g. multilayer perceptron, convolutional neural network) can also be used and the variations therein comprise a continuum of models trading off complexity for performance.

In the testing phase 850, the test battery alone is used. At 852, multiple impedance responses (two or more), as described above, may be measured for every cycle. The impedance responses may be measured during charging and/or steady state conditions, as described above with reference to FIGS. 4-6. At 854, based on the measured impedance responses, impedance responses at different frequencies may be collected.

At 856, based on the measured impedance responses, features of the battery may be calculated. At 820, calculated feature of the test battery may be inputted into the recurrent neural network model trained in the learning phase 810. The recurrent neural network model may use the current measured impedance response(s) as well as older impedance responses (e.g., N impedance measurements) to calculate the total capacity of the battery at 860.

Figure 9:
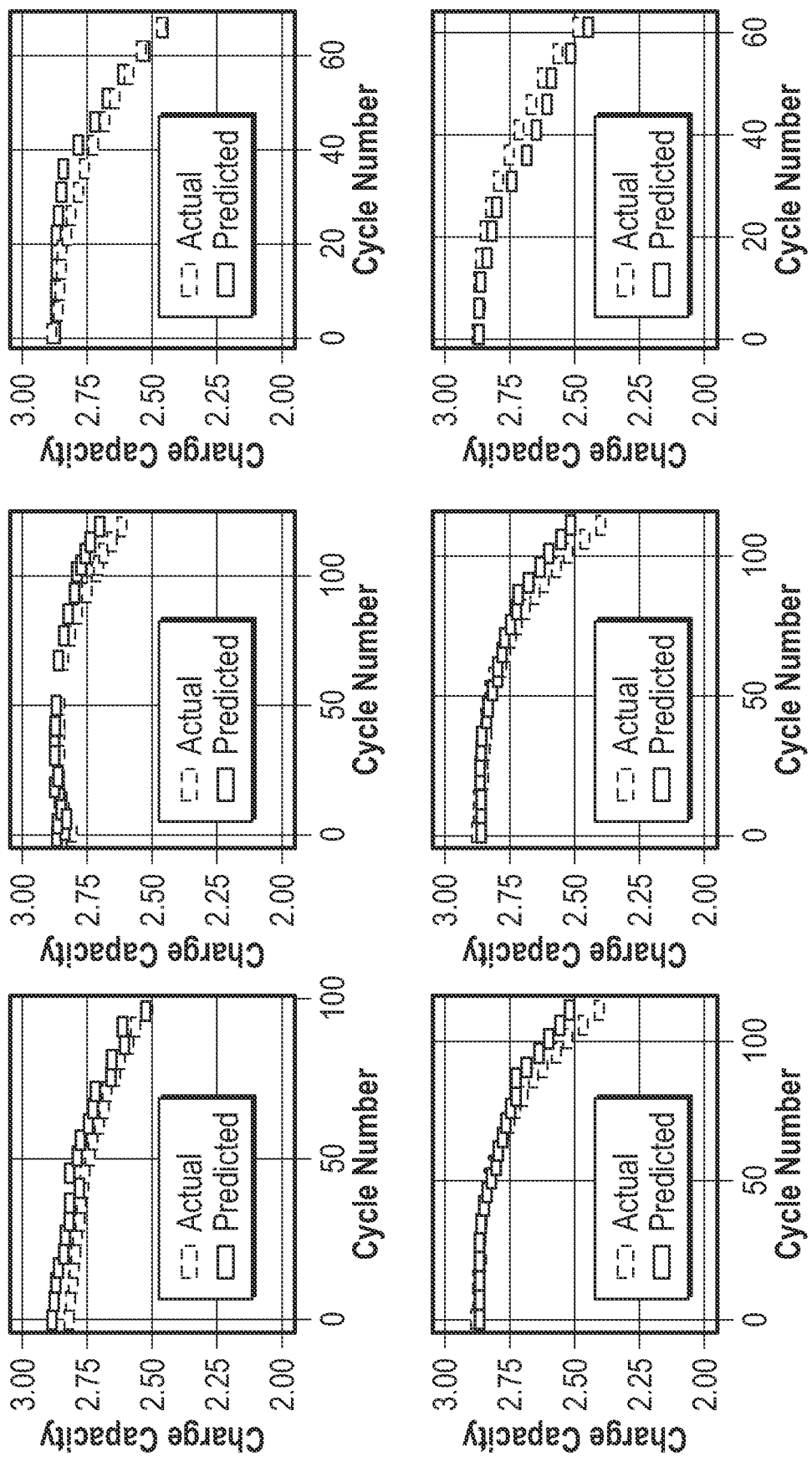
FIG. 9 illustrates example plots of total charge capacity showing both predicted capacity and actual measurements.
Figure 10A:
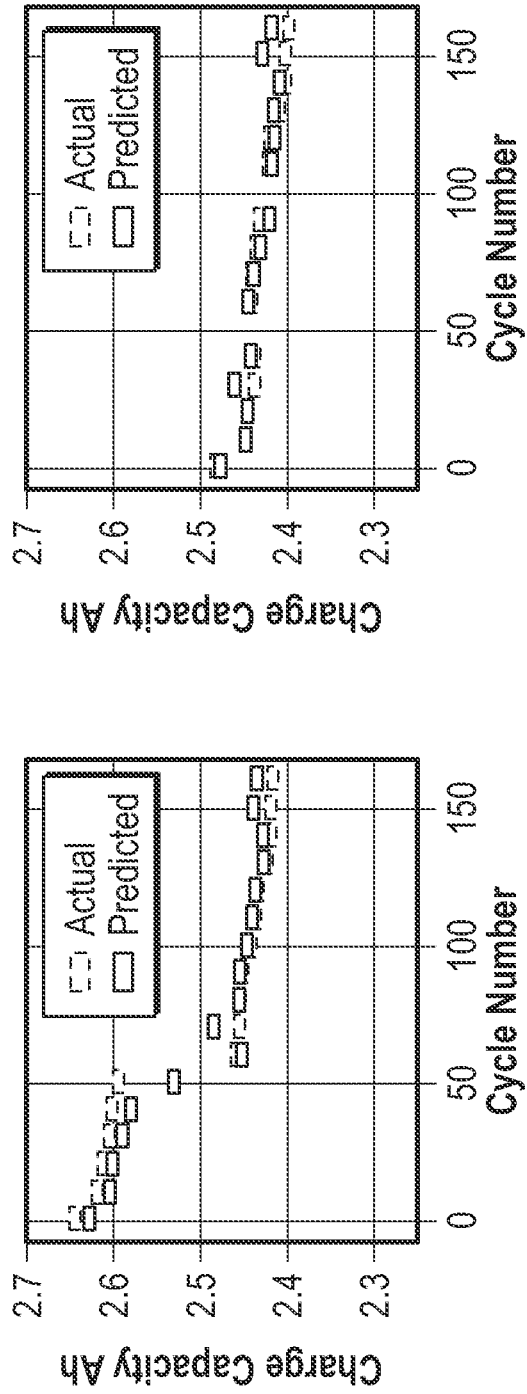
FIGS. 10A-10C illustrate example plots of total charge capacity showing both predicted capacity and actual measurements at different temperatures.
Figure 10A:
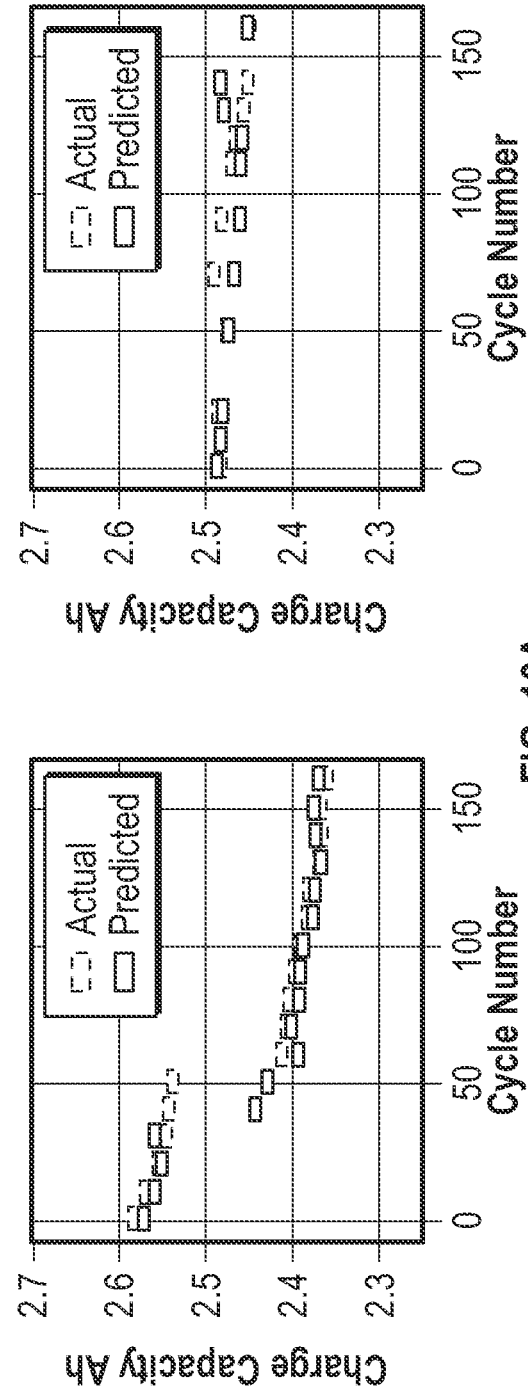
Figure 10B:
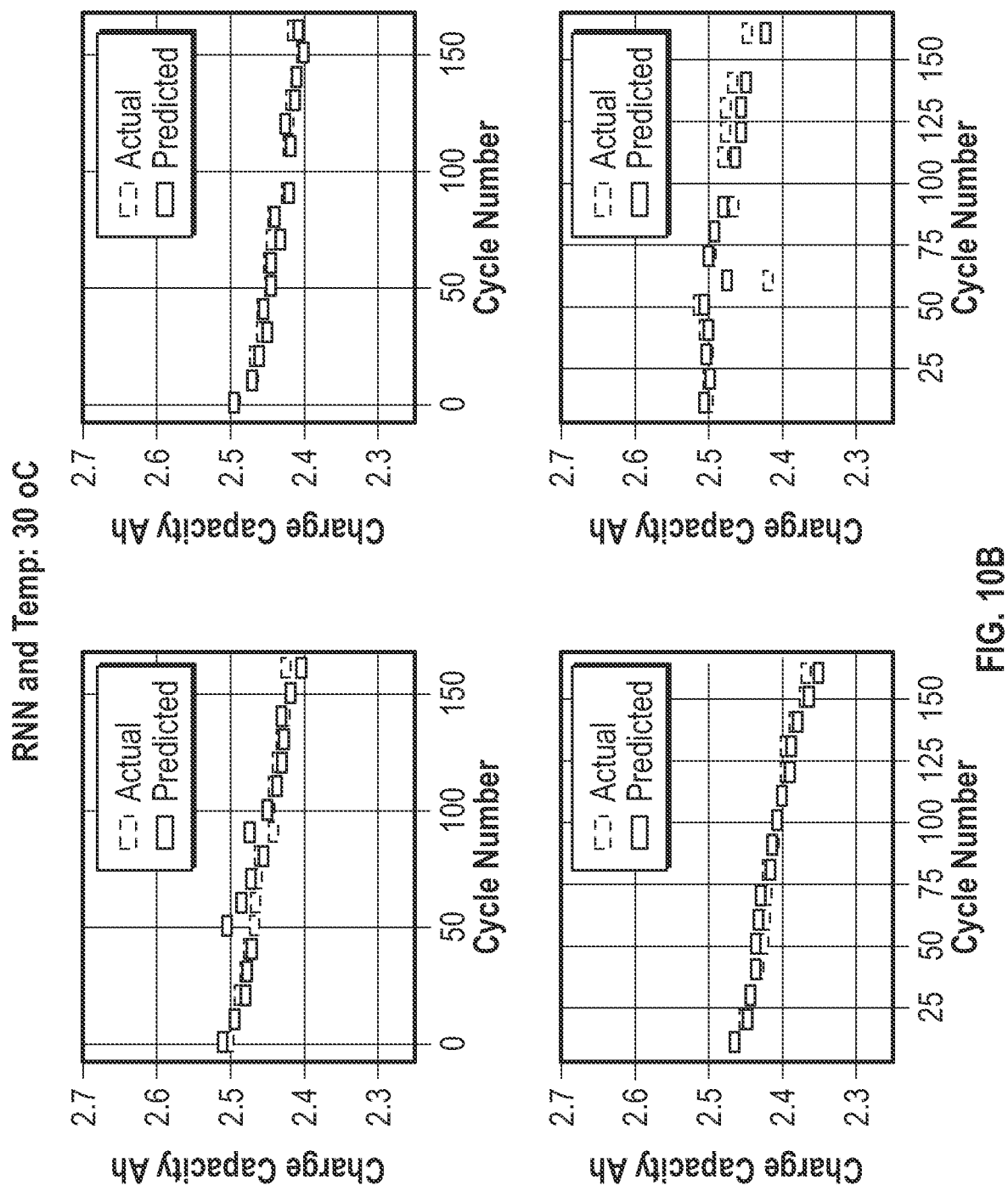
Figure 10C:
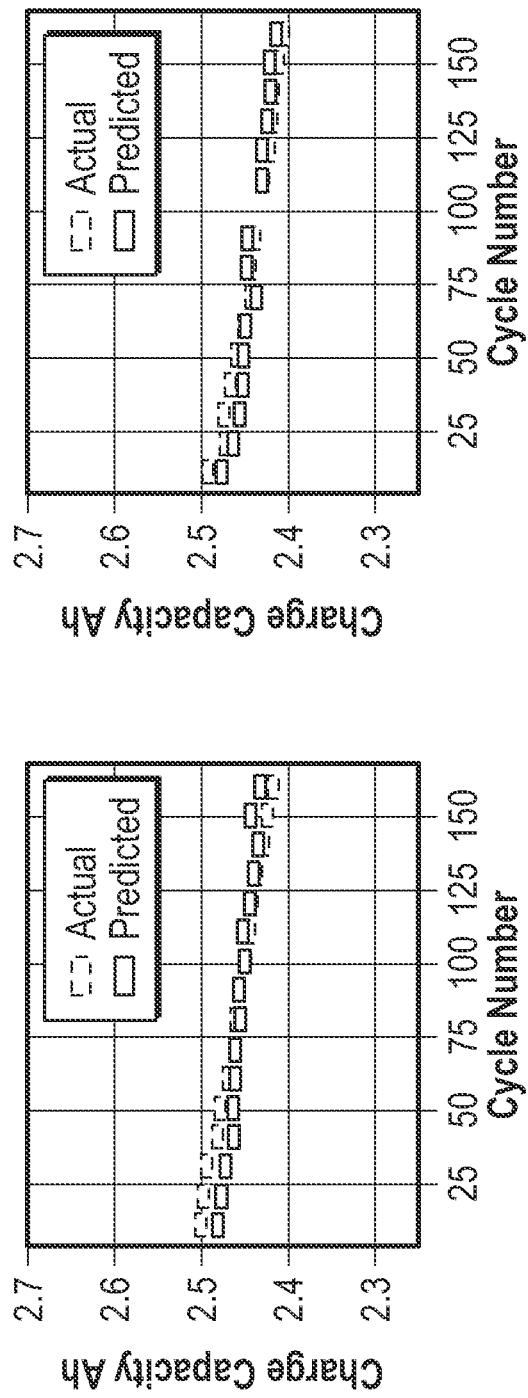
Figure 10C:
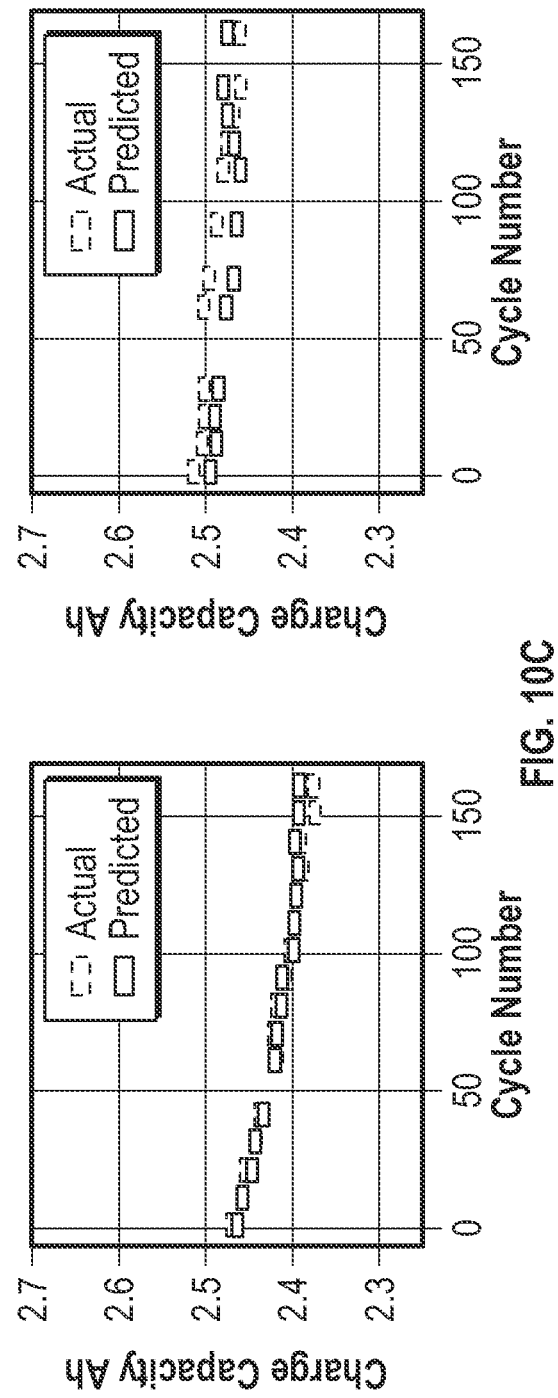

FIG. 9 illustrates example plots of total charge capacity showing both predicted capacity using the techniques described herein and actual measurements. As discussed above, the techniques described herein may be used to estimate total capacity at different temperatures. FIGS. 10A-10C illustrate example plots of total charge capacity showing both predicted capacity using the techniques described herein and actual measurements at different temperatures (e.g., 20° C., 30° C., 40° C.).

VARIOUS NOTES

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

The invention claimed is:

1. A method to monitor a battery, the method comprising:
   receiving a first impedance measurement from the battery in response to a first multi-frequency sweep after the battery is charged to substantially full charge using a constant current;
   receiving a second impedance measurement from the battery in response to a second multi-frequency sweep after a specified wait time measured from when the substantially full charge is saturated using a constant voltage; and
   based on the first and second impedance measurements, determining an estimated capacity of the battery using a regression model.

2. The method of claim 1, wherein the second impedance measurement is obtained during a steady state of the battery.

3. The method of claim 1, wherein in the regression model is a recurrent neural network model.

4. The method of claim 3, wherein the recurrent neural network model is trained using impedance measurements of another battery.

5. The method of claim 4, wherein the recurrent neural network is trained based on a calculated charge capacity per cycle of another battery.

6. The method of claim 1, wherein the first and second impedance measurements are taken at a first temperature and the estimated capacity is for a second temperature that is different from the first temperature.

7. A method to detect an anomaly in a battery, the method comprising:
   receiving a first impedance measurement from the battery in response to a first multi-frequency sweep after the battery is charged to substantially full charge using a constant current;
   receiving a second impedance measurement from the battery in response to a second multi-frequency sweep after a specified wait time measured from when the substantially full charge is saturated using a constant voltage; and
   based on the first and second impedance measurements, detecting the anomaly in the battery.

8. The method of claim 7, further comprising:
   determining a shift in impedance between the first and second impedance measurements; and
   comparing the shift to an expected value for the shift.

9. The method of claim 8, wherein the expected value for the shift is based on an age of the battery.

10. The method of claim 8, wherein the expected value for the shift is based on a model generated using another battery.

11. The method of claim 7, wherein the second impedance measurement is obtained during a steady state of the battery.

12. A battery management system comprising:
    at least one hardware processor; and
    at least one memory storing instructions that, when executed by the at least one hardware processor, cause the at least one hardware processor to perform operations comprising:
    receiving a first impedance measurement from the battery in response to a first multi-frequency sweep after the battery is charged to substantially full charge using a constant current;
    receiving a second impedance measurement from the battery in response to a second multi-frequency sweep after a specified wait time measured from when the substantially full charge is saturated using a constant voltage;
    based on the first and second impedance measurements, generating an estimated capacity of the battery using a regression model; and
    detecting an anomaly in the battery.

13. The system of claim 12, wherein the second impedance measurement is obtained during a steady state of the battery.

14. The system of claim 12, wherein generating the estimated capacity includes inputting the first and second impedance measurements in a recurrent neural network model.

* * * * *